United States Patent [19]

Désormière et al.

[11] 4,137,470
[45] Jan. 30, 1979

[54] MAGNETOSTRICTIVE ELASTIC SURFACE WAVE STRUCTURE

[75] Inventors: Bernard Désormière; Gérard Volluet, both of Paris, France

[73] Assignee: Thomson-CSF, Paris, France

[21] Appl. No.: 775,515

[22] Filed: Mar. 8, 1977

[30] Foreign Application Priority Data

Mar. 11, 1976 [FR] France ............................... 76 06906

[51] Int. Cl.² ............................................ H01L 41/14
[52] U.S. Cl. ..................................... 310/26; 310/313; 333/30 M
[58] Field of Search ................ 310/26, 313; 333/30 M

[56] References Cited

U.S. PATENT DOCUMENTS 3,696,312  10/1972  Kuhn ............................ 333/30 M X
3,713,049  1/1973   Desormiere .................. 333/30 M X

OTHER PUBLICATIONS

Surface Elastic Waves by Richard M. White, Proceedings of IEEE, vol. 58, No. 8, Aug. 1970, pp. 1238, 1247–1250.

*Primary Examiner*—Mark O. Budd
*Attorney, Agent, or Firm*—Cushman, Darby & Cushman

[57] ABSTRACT

The invention relates to elastic surface-wave structures. The elastic surface wave structure in accordance with the invention comprises a non magnetic substrate and a surface wave transducer containing at least one emissive zone situated in a deposited layer of magnetostrictive material subjected to an alternating magnetic field and to a magnetic polarization field.

20 Claims, 14 Drawing Figures

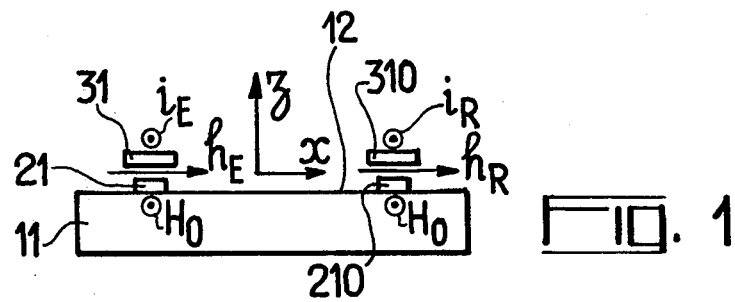
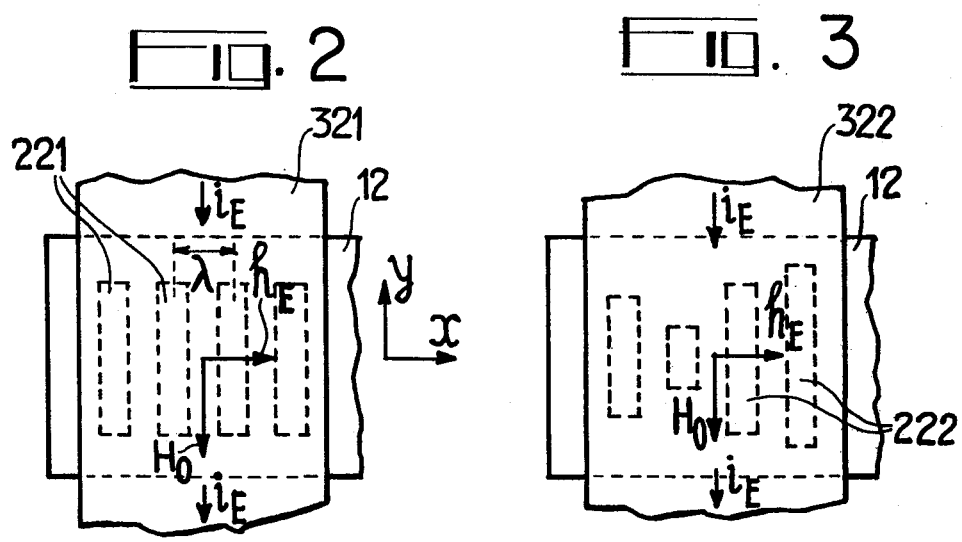
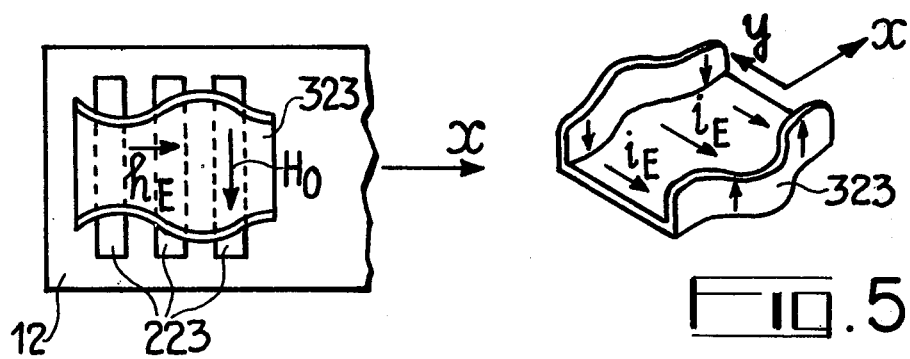

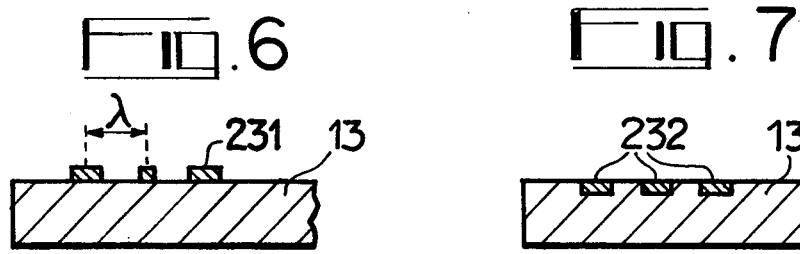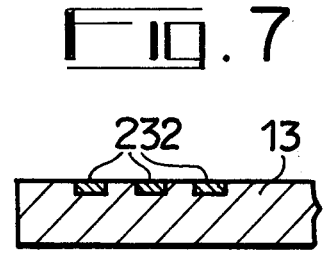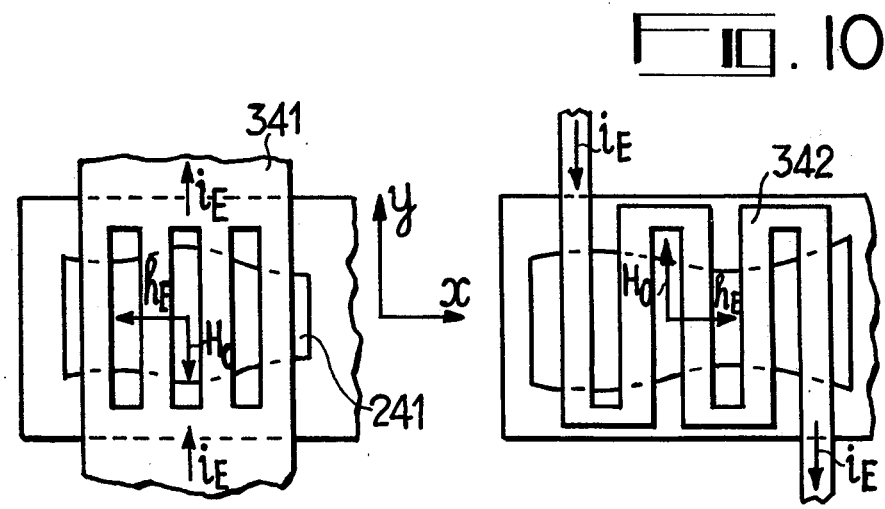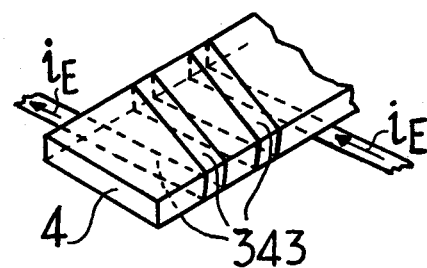

MAGNETOSTRICTIVE ELASTIC SURFACE WAVE STRUCTURE

This invention relates to elastic surface-wave structures and to their associated tranducers made of magnetostrictive material which are used inter alia for the construction of delay lines, filters and resonators.

Currently, elastic surface-wave structures use as transducers thin piezoelectric plates on the surface of which electrodes are deposited in the form of combs with interdigital teeth. The operating frequency is related to the spacing of the teeth which should not fall below a certain limit imposed by the technique by which the electrodes are deposited. In addition, the presence of transducer combs made from materials of which the mechanical properties differ from those of the piezoelectric plate, introduces mechanical impedance mismatch into the path of the surface waves which gives rise to undesirable reflections at the level of the teeth of the comb.

The transmission of elastic bulk waves generated by magnetostrictive effect is known, as is the transmission of elastic shear waves by means of a thin film of ferromagnetic material divided into magnetic zones by a polarisation field of variable intensity. In these structures, the conversion yield is not optimal because the magnetic susceptibility of the material is not exploited in the frequency range containing the gyromagnetic resonance frequencies. In the case of elastic waves produced by a thin film, it is the magnetic polarisation field which determines the spacing of the magnetic zones in the propagation direction. Accordingly, the pulse response of conventional magnetostrictive transducers is in no way related to the choice of a structural configuration such as is encountered in the field of piezoelectric transducers of the interdigital comb type.

The object of the invention is to provide magnetostrictive transducers for the transmission and reception of elastic surface waves (Rayleigh waves), comprising a periodic structure which is not dependent in its configuration upon the intensity of a magnetic polarisation field, but only, if necessary, by its spatial distribution. The application of an inductor field enables the conversion efficiency of the transducer to be optimised in a frequency range which contains one of the gyromagnetic resonance frequencies. The use of a magnetostrictive film of ferromagnetic or ferrimagnetic material, of which the mechanical characteristics are very similar to those of the substrate intended to propagate the elastic surface waves, enables the parasitic reflections to be eliminated or minimised to a negligible level.

In accordance with the present invention, there is provided a magnetostrictive elastic surface-wave structure comprising a non magnetic substrate and at least one electromechanical transducer arranged on a free major face of said magnetic substrate for converting electrical energy into said elastic surface wave and vice-versa; said electromechanical transducer comprising a deposit of magnetostrictive material overlaying a portion of said major face, electrical conductive means located above said deposit for creating therein an alternating magnetic field in response to said electrical energy, and inductor means creating in said deposit a d.c. bias magnetic field; said deposit comprising at least one radiating strip; the pattern of said strip being in the form of one wavefront of said elastic surface wave, and delimited by the geometrical configuration of said deposit.

For a better understanding of the present invention, and to show how the same may be carried into effect, reference will be made to the following description in conjunction with the accompanying drawings, wherein:

FIG. 1 shows a magnetostrictive elastic surface-wave structure according to the invention;

FIGS. 2, 3, 4 and 5 show variants of the transducers illustrated in FIG. 1;

Figure 12:
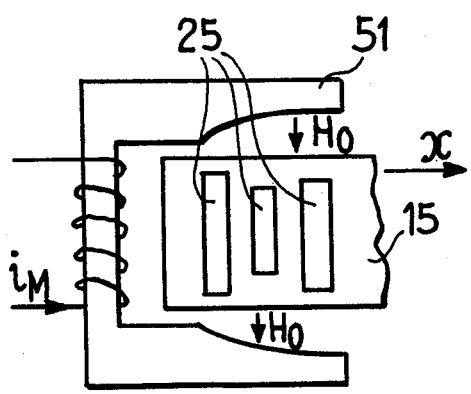
Figure 13:
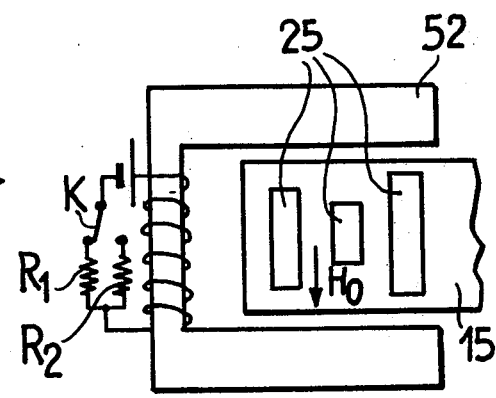
Figure 14:
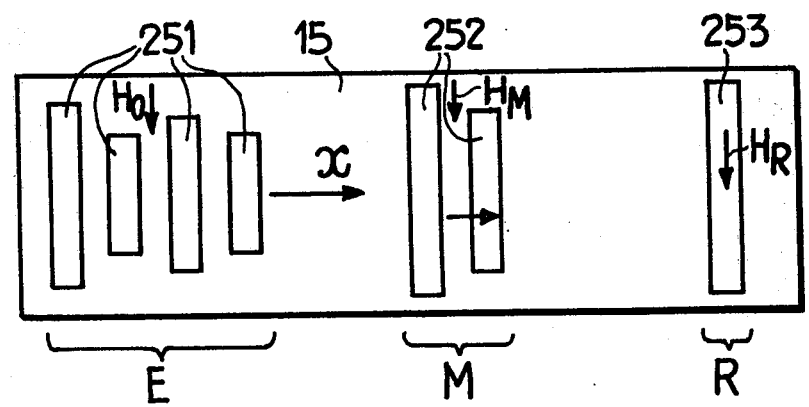

FIGS. 6, 7 and 8 diagrammatically illustrate other structural details of the transducers illustrated in FIG. 1;

FIGS. 9, 10 and 11 show other configurations of the excitation means suitable for use in the magnetostrictive transducers according to the invention;

FIGS. 12, 13 and 14 show means for generating the magnetic fields required for polarising the transducers according to the invention.

FIG. 1 diagrammatically illustrates a magnetostrictive elastic surface-wave structure comprising: a substrate 11 of non-magnetic material on the free major face of which elastic surface waves exchanged between a transmitting transducer and a receiving transducer travel in the direction x. The transmitting transducer comprises a strip 21 of magnetostrictive material, whilst the receiving transducer comprises a second strip 210 of magnetostrictive material. The strips 21 and 210 are surmounted by conductive strips 31 and 310 to excite an alternating magnetic field or to collect an induced electromotive force. Biasing means (not shown in FIG. 1) create magnetic polarisation fields $\vec{H_o}$ oriented perpendicularly of the plane xz. The axis z is oriented perpendicularly of the major face of the substrate 11. The polarisation field $\vec{H_o}$ fixes the value of the gyromagnetic resonance frequency of the constituent material of the strips 21 and 210. The field $\vec{h_e}$ induced by the passage of current $i_E$ through the conductive strip 31 is oriented perpendicularly of $\vec{H_o}$ which, by magnetostrictive effect, produces an alternate deformation of the strip 21 in a direction contained in the plane x, z. The deformations which the strip 21 undergoes are in phase along the strip and produce elastic surface waves which are propagated perpendicularly of that length and, hence, parallel to the axis x. The variable magnetic field $\vec{h_e}$ is produced by the current $i_E$ flowing through a strip 31 which is arranged above the strip 21. The surface waves thus transmitted are propagated along the axis x and encounter the receiving strip 210 disposed parallel to the strip 21. The process by which these waves are received is the reverse of their transmission process. These waves excite the precession movement of the magnetic moments in the strip 210 and this precession generates, at the level of the conductive strip 310, an alternating magnetic field $h_R$ which creates an alternating electromotive force capable of inducing a receiving current $i_R$.

In order to obtain a suitable conversion efficiency at the level of the transmitting and receiving transducers, the intensity of the magnetic field $\vec{H_o}$ is adjusted in such a way as to obtain a high alternating susceptibility. This condition is fulfilled when the excitation frequency f of the surface waves corresponds to one of the gyromagnetic resonance frequencies of the constituent ferromagnetic or ferrimagnetic material of the magnetostrictive strips. The gyromagnetic resonance frequencies are dependent upon the field $\vec{H_o}$. In order to enable the deformation which the strip undergoes to be optimally transmitted to the substrate and in order ultimately to obtain the best mechanical coupling without any mechanical impedance mismatch, there has been provided, for example, an epitaxial magnetostrictive layer of ferrimagnetic garnet, YIG ($Y_3 Fe_5 O_{12}$). This deposit is effected on a substrate of non-ferrimagnetic garnet, GGG ($Gd_3 Ga_5 O_{12}$), of which the surface is cut along the section <111>. The crystalline structures of the two garnets are very similar, which minimises the reflection of the surface waves on encountering the radiating strips. The arrangement adopted in FIG. 1 shows that the transmitting and receiving transducers are each formed by only one isolated strip. In practice, in order to increase the conversion efficiency of the transducers, it is of advantage to group several strips to form a network of equidistant elements of which the individual radiations are added to one another. Arrangements comprising several strips are illustrated in FIG. 2. It has been assumed that the spacing of the strips is equal to $\lambda$, the wavelength of the surface waves propagated at the surface 12 of the substrate 11.

In addition, FIGS. 2, 3, 4 and 5 are confined to the case of strips in the form of rectilinear bands of which the length is substantially greater than the wavelength $\lambda$. Under these conditions, the surface waves are transmitted in the direction x and their wave fronts are rectilinear and parallel to the direction y. It is obvious that surface waves with a non-rectilinear wavefront may be transmitted in cases where strips having a pattern in the form of curved bands are used.

FIGS. 2, 3, 4 and 5 show plan views of sets of magnetostrictive strips capable of forming networks according to the invention. In FIGS. 2 and 4, the strips 221 and 223 are respectively equal in length along the axis y, which is not the case with the strips 222 shown in FIG. 3.

In the three FIGS. 2, 3 and 4, the conductors 321, 322 and 323 which serve to excite the alternating magnetic field are metallic foils in which in-phase alternating currents flow in the same direction. All the strips are excited in phase by the alternating magnetic field $\vec{h}_e$.

The configuration shown in FIG. 2 consists of a network of magnetostrictive strips 221 of equal length. They are excited in phase over their entire length by the conductive layer 321 covering them. Accordingly, there is obtained a pulse response formed by a sequence of pulses which have a constant spacing and are equal in amplitude. To form a transducer embodying a weighting law based on the amplitudes, it can be seen in FIG. 3 that it is possible to use a network of which the strips 222 are of unequal length. In this case, the alternating exciter field $\vec{h}_e$ exists with the same intensity and with the same phase throughout the entire conductive layer 322.

FIG. 4 shows another configuration which embodies a weighting law of the radiating elements of a transducer by using strips 222 of equal length, but an exciting plate 323 which gives alternating magnetic fields $\vec{h}_e$ which only exist over part of the length of the strips and which may have unequal intensities. FIG. 5 shows the exciting plate 323 which is formed by a profiled conductive film surrounded by two marginal current-carrying conductors. In the direction x, the intensity of the current $i_E$ is proportional to the inverse of the distance separating the marginal conductors.

FIGS. 6, 7 and 8 show several sectional views illustrating how the substrates can be formed with their magnetostrictive strips. In FIG. 6, the strips 231 of magnetostrictive material are deposited on the surface of the non-magnetic substrate 13, for example by epitaxial growth. To this end, a uniform layer is deposited by epitaxial growth and is then etched or eroded to obtain the required geometrical configuration. The spacing of the strips is equal to the acoustic wavelength or to a fraction thereof, as will be seen hereinafter.

Without departing from the scope of the invention, the distance between the strips may be non-uniform. This variant is of interest for the construction of surface-wave structures which may be used for the compression of pulses and for the matched filtering.

In FIG. 7, the strips 231 are buried and deposited after selective etching or erosion of the substrate 13. This solution is of advantage in the respect that it eliminates parasitic reflections. In FIG. 8, the deposit of magnetostrictive material 233 is etched in only part of its thickness to obtain a periodic structure comparable with a network or strips. This particular variant reduces the parasitic reflections.

In the configurations illustrated in FIGS. 2, 3, 4 and 5, the alternating magnetic field is excited by a solid conductive foil and the radiating elements are delimited by the deposit of strips spaced apart from one another. It is also possible to use an excitation structure which enables a succession of radiating zones in the form of bands to be materialised in the presence of a continuous deposit of magnetostrictive material.

FIGS. 9, 10 and 11 show configurations by which it is possible to obtain a radiation by several sources using a continuous deposit of magnetostrictive material. In FIG. 9, the excitation conductor 341 is divided into equidistant strips of which the spacing is equal to the acoustic wavelength. The deposit of magnetostrictive material 241 has a width in the direction y which is modulated to embody the required weighting law. In FIG. 10, the excitation conductor 342 is bent back so that the excitation current flows in the opposite direction from one band to the next. The parallel bands are spaced apart by a distance corresponding to half the acoustic wavelength. In FIG. 11, the excitation conductor 343 is wound onto a core 4 and the parallel half-turns situated on the surface nearest the deposit of magnetostrictive material are spaced apart by a distance corresponding to the wavelength.

FIGS. 12, 13 and 14 show means for creating the magnetic polarization field $\vec{H}_0$. The magnetic polarization field exerts a direct influence upon the conversion efficiency of the magnetostrictive transducer, because the alternating susceptibility of the material varies considerably when the operating frequency and a gyromagnetic resonance frequency are close to one another. It is therefore possible to construct a transducer in which the weighting of the individual sources results from a spatial variation of the intensity of the magnetic polarization field. This variant is shown in FIG. 12 which shows a substrate 15 provided with magnetostrictive strips 25. The surface wave transducer thus formed is subjected to a magnetic polarization field $\vec{H}_0$ which is produced by a field magnet 51. The field magnet 51 is in the form of an electromagnet of which the winding is traversed by the current $i_M$. The air gap does not have a constant width so that a non-uniform field intensity $\vec{H}_0$ is obtained in the direction x.

In the configuration shown in FIG. 13, the field magnet 52 producing the polarization field $\vec{H}_0$ is fed by an electrical source $E_M$ via two switchable resistors $R_1$ and $R_2$. The switching K enables the intensity of the polarization field $\vec{H}_0$ to be selected from two separate values. For one of the selected values, the transducer 25 transmits or receives surface waves which are propagated along the surface of the substrate 15. For the other of the selected values, the transducer 25 is deactivated.

Naturally, the invention is not limited to the all-or-nothing operation which has just been described. It is possible to modulate the intensity of the current flowing through the winding of the field magnet so as to modulate the amplitude of the surface waves transmitted by the magnetostrictive transducer.

In FIG. 14, the magnetostrictive elastic surface-wave structure comprises a substrate 15 onto which three networks of strips are deposited. A transmitting transducer E comprises strips 251 which transmit surface waves in the direction of the axis x. A modulating transducer M comprises, for example, strips 252 and a receiving transducer R is provided to collect the surface waves transmitted by the transducer E which have traversed the transducer M. The transducer R comprises the magnetostrictive strip 253.

The means for exciting the alternating magnetic field, which normally overhang the magnetostrictive strips, have not been shown in any of the configurations illustrated in FIGS. 12, 13 and 14. With regard to the configuration of FIG. 14, the means for inducing the magnetic polarization field have not been shown.

However, it can be seen in FIG. 14, that the transducer E is subjected to a polarization field $\vec{H_0}$, whilst the transducers M and R are respectively subjected to magnetic polarization fields $\vec{H_M}$ and $\vec{H_R}$. In cases where it is desired to effect an exchange of vibratory energy between the transducer E and the transducer M, the field $\vec{H_M}$ is applied with the appropriate intensity and the field $\vec{H_R}$ is eliminated. The transducer M is thus activated whilst the transducer R is deactivated. In order to effect an exchange of energy between the transducer E and the transducer R, it is the field $\vec{H_R}$ which is applied and the field $\vec{H_M}$ eliminated. Under these conditions, the surface waves pass through the transducer M without undergoing any parasitic reflections and without being attenuated. It is of course possible, by acting on the excitation field intensities of the transducers M and R, to effect a progressive fractionation of the vibratory energy, the fractions being collected by the transducers M and R in any proportions.

What we claim is:

1. A magnetostrictive elastic surface wave structure comprising a non-magnetic substrate and at least one electromechanical transducer arranged on a free major face of said non-magnetic substrate for converting electrical energy into said elastic surface wave and vice-versa; said electromechanical transducer comprising: a deposit of magnetostrictive material overlaying a portion of said major face, electrical conductive means located above said deposit for creating therein an alternating magnetic field in response to said electrical energy and inductor means creating in said deposit a d.c. bias magnetic field; said elastic surface wave being launched by at least one radiating element pertaining to said deposit; the pattern of said element being in the form of one wavefront of said elastic surface wave and delimited by the geometrical configuration of said deposit.

2. A structure as claimed in claim 1, wherein said electromechanical transducer comprises a plurality of coplanar radiating elements pertaining to said deposit; said radiating elements being separated from one another by non radiating gaps.

3. A structure as claimed in claim 2, wherein the spacing of said radiating elements is substantially equal to the wavelength of said elastic surface waves.

4. A structure as claimed in claim 2, wherein the spacing of said radiating elements is substantially equal to half the wavelength of said elastic surface waves.

5. A structure as claimed in claim 2, wherein said radiating elements are strips having substantially the same length.

6. A structure as claimed in claim 2, wherein said radiating elements are strips having unequal lengths.

7. A structure as claimed in claim 1, wherein said deposit has a uniform thickness; said electrical conductive means comprising a conductive structure forming a set of interconnected coplanar strips overlaying said deposit for creating a plurality of coplanar radiating elements.

8. A structure as claimed in claim 2, wherein said radiating elements are separated from one another by said non-radiating gaps; said electrical conductive means comprising a conductive sheet overlaying said deposit.

9. A structure as claimed in claim 1, wherein the width of said deposit is substantially constant in the direction perpendicular to the direction of propagation of said elastic surface waves.

10. A structure as claimed in claim 1, wherein, for weighting the radiating intensity of said radiating elements, the width of said deposit, as measured transversely in relation to the propagation direction of said elastic surface waves, has a non-uniform value.

11. A structure as claimed in claim 2, wherein the width of said non-radiating gaps is non-uniform along said deposit.

12. A structure as claimed in claim 1, wherein said inductor means comprise a field magnet and a source of electrical energy connected to a winding wound on the magnetic core of said field magnet.

13. A structure as claimed in claim 12, wherein said d.c. bias magnetic field has a non-uniform intensity in the propagation direction of said surface waves.

14. A structure as claimed in claim 12, wherein said d.c. bias magnetic field is adjusted for causing the frequency of said surface waves to coincide with the gyromagnetic resonance frequency of said magnetostrictive material.

15. A structure as claimed in claim 12, wherein the intensity of said d.c. bias magnetic field may assume at least two separate values under the control of switching means.

16. A structure as claimed in claim 15, wherein one of said separate values is equal to zero.

17. A structure as claimed in claim 1, wherein said magnetostrictive material is ferrimagnetic.

18. A structure as claimed in claim 17, wherein said ferrimagnetic material is a garnet of yttrium and iron; said non magnetic substrate being a garnet of $Gd_3 Ga_5 O_{12}$.

19. A structure as claimed in claim 1 wherein said deposit is buried in said substrate.

20. A structure as claimed in claim 2, wherein said deposit is provided with a plurality of ridges constituting said radiating elements.